United States Patent
Kim et al.

(10) Patent No.: US 9,905,681 B2
(45) Date of Patent: Feb. 27, 2018

(54) POWER SEMICONDUCTOR DEVICE AND METHOD OF FABRICATING THE SAME

(71) Applicant: HYUNDAI AUTRON CO., LTD., Seongnam-si (KR)

(72) Inventors: Young Joon Kim, Suwon-si (KR); Hyuk Woo, Incheon (KR); Tae Yeop Kim, Seoul (KR); Han Sin Cho, Hwaseong-si (KR); Tae Young Park, Gunpo-si (KR); Ju Hwan Lee, Suwon-si (KR)

(73) Assignee: HYUNDAI AUTRON CO., LTD., Seongnam-si (KR)

( * ) Notice: Subject to any disclaimer, the term of this patent is extended or adjusted under 35 U.S.C. 154(b) by 0 days.

(21) Appl. No.: 15/628,413

(22) Filed: Jun. 20, 2017

(65) Prior Publication Data
US 2017/0365696 A1    Dec. 21, 2017

(30) Foreign Application Priority Data
Jun. 21, 2016  (KR) .......................... 10-2016-0077602

(51) Int. Cl.
*H01L 29/78* (2006.01)
*H01L 29/739* (2006.01)
*H01L 29/10* (2006.01)
*H01L 29/66* (2006.01)

(52) U.S. Cl.
CPC ...... *H01L 29/7397* (2013.01); *H01L 29/1095* (2013.01); *H01L 29/66348* (2013.01); *H01L 29/7813* (2013.01)

(58) Field of Classification Search
CPC ....................... H01L 21/8232; H01L 21/66007
See application file for complete search history.

(56) References Cited

U.S. PATENT DOCUMENTS 7,470,953 B2 * 12/2008 Takaya ................ H01L 29/0623
257/330

FOREIGN PATENT DOCUMENTS

| KR | 10-2013-0080767 A | 7/2013 |
|---|---|---|
| KR | 10-2014-0057630 A | 5/2014 |

* cited by examiner

*Primary Examiner* — Cheung Lee
(74) *Attorney, Agent, or Firm* — Morgan, Lewis & Bockius LLP

(57) ABSTRACT

Provided is a power semiconductor device comprising a pair of gate electrodes respectively disposed in a first trench and a second trench spaced apart from each other in a substrate; a body region having a first conductivity type disposed between the first trench and the second trench; a pair of floating regions having a first conductivity type spaced apart from each other and surrounding a bottom surface and at least one side surface of the first trench and the second trench, respectively; and a drift region having a second conductivity type which extends from below the pair of floating regions through a region between the pair of floating regions to the body region, wherein, in the drift region, the doping concentration of a second conductivity type between the pair of floating regions is higher than the doping concentration of a second conductivity type below the pair of floating regions.

16 Claims, 3 Drawing Sheets

POWER SEMICONDUCTOR DEVICE AND METHOD OF FABRICATING THE SAME

CROSS-REFERENCE TO RELATED APPLICATIONS

This application claims priority to and the benefit of Korean Patent Application No. 10-2016-0077602 filed in the Korean Intellectual Property Office on Jun. 21, 2016, the entire contents of which are incorporated herein by reference.

BACKGROUND

Field

The present invention relates to a power semiconductor device and a manufacturing method thereof, and more particularly, to an insulated gate bipolar transistor (IGBT) device and a manufacturing method thereof.

Related Technology

Insulated gate bipolar transistor (IGBT) is developed through a functional integration of metal-oxide-semiconductor (MOS) technology and bipolar physics. It is characterized by its low saturation voltage and fast-switching capabilities. Its application is expanded to applications that cannot be realized with thyristors, bipolar transistors, MOSFET, etc. It also is a next-generation power semiconductor device that is essentially used in a high-efficiency, high-speed power system widely used in a voltage range of 300 V or higher. Since the development of power MOSFETs in the 1970s, MOSFETs have been used as switching devices in the fields where fast-switching capabilities are required, while bipolar transistors, thyristors, GTOs, etc. have been used in the fields where a large amount of current conduction is required at medium to high voltages. The IGBT, which was developed in the early 1980s, has a better current capability than bipolar transistors in terms of output characteristics and has gate driving characteristics like MOSFETs in terms of input characteristics, and therefore it is capable of switching at a high speed of about 100 KHz. Accordingly, the IGBT is being used in a wide range of applications, from industrial to home electronics since it is used not only for devices to replace MOSFETs, bipolar transistors, and thyristors but also for creating new application systems.

A related prior art is Korean Laid-Open Publication No. 20140057630 (published on May 13, 2014, entitled "IGBT and manufacturing method thereof").

SUMMARY

An object of the present invention is to provide a power semiconductor device capable of lowering the resistance and improving the short circuit and the breakdown voltage characteristic, and a method of manufacturing the same. However, these problems are illustrative, and thus the scope of the present invention is not limited thereto.

A power semiconductor device according to an aspect of the present invention for solving the above problems is provided. The power semiconductor device includes: a pair of gate electrodes respectively disposed in a first trench and a second trench spaced apart from each other in the substrate; a body region having a first conductivity type disposed between the first trench and the second trench in the substrate; a pair of floating regions having a first conductivity type spaced apart from each other and surrounding a bottom surface and at least one side surface of the first trench and the second trench, respectively, in the substrate; and a drift region having a second conductivity type which extends from below the pair of floating regions having a first conductivity type in the substrate through a region between the pair of floating regions having a first conductivity type to the body region having a first conductivity type, wherein, in the drift region, the doping concentration of a second conductivity type between the pair of floating regions having a first conductivity type is higher than the doping concentration of a second conductivity type below the pair of floating regions having a first conductivity type.

In the power semiconductor device, the maximum doping depth of the body region having a first conductivity type may be smaller than the depths of the first trench and the second trench, and the maximum doping depth of the floating regions having a first conductivity type may be larger than the depths of the first trench and the second trench. Here, in the drift region, the doping concentration of a second conductivity type between the pair of the floating regions having a first conductivity type and the doping concentration of a second conductivity type between the first trench and the second trench may be larger than the doping concentration of a second conductivity type below the pair of floating regions having a first conductivity type.

The power semiconductor device may further include a base current path between the pair of floating regions having a first conductivity type and between the first trench and the second trench, wherein a maximum electric field may be generated in a region of a bottom surface of the pair of floating regions having a first conductivity type.

In the power semiconductor device, in a vertical distribution of the electric field from an upper surface of the substrate through a region between the pair of floating regions having a first conductivity type to a lower surface of the substrate, a depth at which a maximum electric field is located may be larger than the depths of the first trench and the second trench.

In the power semiconductor device, the substrate may include a wafer and an epitaxial layer grown on the wafer, and lower portions of the floating regions having a first conductivity type may include a boundary surface between the wafer and the epitaxial layer.

The power semiconductor device may further include a pair of source regions that are spaced apart from each other and disposed adjacent to the first trench and the second trench in the substrate, respectively.

In the power semiconductor device, the second conductivity type and the first conductivity type may have opposite conductivity types and may be each one of n-type and p-type.

According to another aspect of the present invention, there is provided a method for fabricating a power semiconductor device. The method includes: implanting impurities having a first conductivity type into a first region on a wafer; implanting impurities having a second conductivity type, which have a higher doping concentration than that of the impurities having a second conductivity type in the wafer, into a second region on the wafer; forming an epitaxial layer on the wafer; forming a first trench and a second trench spaced apart from each other in a region including a boundary between the first region and the second region, respectively, while removing part of the epitaxial layer; forming a pair of floating regions having a first conductivity type which are spaced apart from each other and surround the bottom surfaces and at least one side surface of the first and second trenches, and at least part of a drift region having a second conductivity type that extends from below the pair of floating regions having a first conductivity type to a region between the pair of floating regions having a first conductivity type, by diffusing the impurities; forming a body region having a first conductivity type and a pair of source regions that are spaced apart from each other and disposed adjacent to the first and second trenches in the body region having a first conductivity type, by implanting impurities into a region between the first trench and the second trench; and forming gate electrodes by lining the inner walls of the first trench and the second trench with an insulating film and filling the first trench and the second trench with a gate electrode material.

In the method of fabricating the power semiconductor device, lower portions of the floating region having a first conductivity type, where the maximum electric field is generated in the base current path, may include a boundary surface between the wafer and the epitaxial layer.

According to an embodiment of the present invention as described above, there is provided a power semiconductor device wherein, even if the distance between the trenches becomes narrow, a base current supply path is formed and an abundant base current is supplied, thereby enhancing robustness. In addition, the local temperature rise is alleviated while increasing the cell density, the short circuit characteristic is improved, and the lowering of breakdown voltage can be mitigated. Of course, the scope of the present invention is not limited by these effects.

EXPLANATION OF REFERENCE NUMERALS

Figure 1:
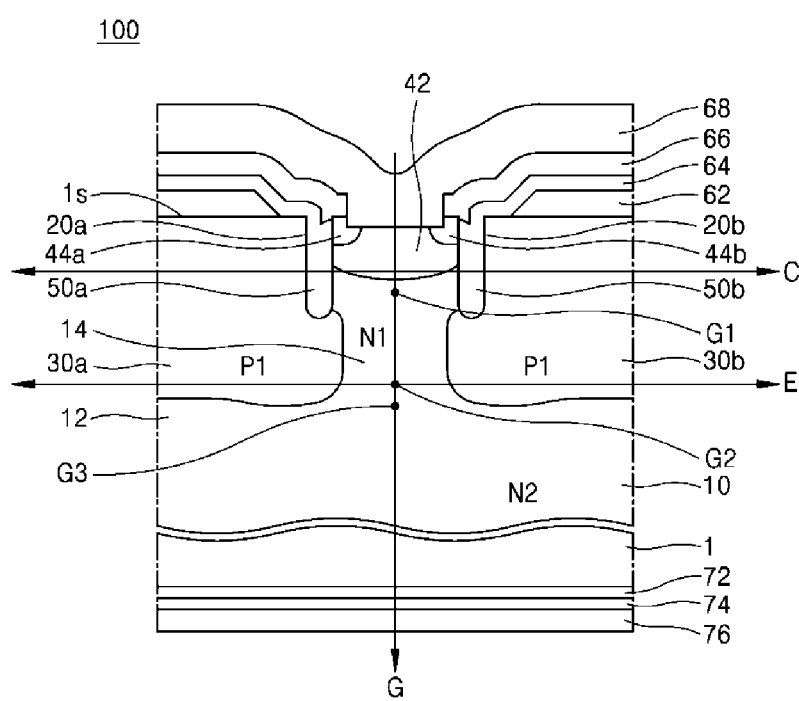
FIG. 1 is a cross-sectional view illustrating a cell structure of a power semiconductor device according to an embodiment of the present invention.

1: substrate
10: drift region
20a, 20b: trench
30a, 30b: floating region
42: body region
44: source region
50a, 50b: gate electrode

DETAILED DESCRIPTION

Hereinafter, embodiments of the present invention will be described in detail with reference to the accompanying drawings. However, it should be understood that the present invention is not limited to the embodiments described below, but may be embodied in various other forms. The following embodiments are intended to give a more complete description of the present disclosure, and are provided in order to fully convey the scope of the disclosure to those skilled in the art. Also, at least some of the components may be exaggerated or reduced in size for convenience of explanation. Like reference numerals refer to like elements throughout the drawings.

In this specification, a first conductivity type and a second conductivity type may have opposite conductivity types, and may be one of n-type and p-type, respectively. For example, the first conductivity type may be of p-type and the second conductivity type may be of n-type, and these conductivity types are illustratively represented in the accompanying drawings. However, the technical idea of the present invention is not limited thereto. For example, the first conductivity type may be of n-type and the second conductivity type may be of p-type.

FIG. 1 is a cross-sectional view illustrating a cell structure of a power semiconductor device according to an embodiment of the present invention.

Referring to FIG. 1, a power semiconductor device 100 according to an embodiment of the present invention includes a pair of gate electrodes 50a and 50b disposed in a first trench 20a and a second trench 20b, respectively, which are spaced apart from each other in the substrate 1. Here, the substrate 1 can be understood to include a wafer and an epitaxial layer that is epitaxially grown on the wafer.

The power semiconductor device 100 according to an embodiment of the present invention includes a body region 42 having a first conductivity type disposed between the first trench 20a and the second trench 20b in the substrate 1, a pair of source regions 44a and 44b having a second conductivity type that are spaced apart from each other and disposed adjacent to the first trench 20a and the second trench 20b in the substrate 42, respectively.

The power semiconductor device 100 according to an embodiment of the present invention includes a floating region 30a having a first conductivity type that surrounds the bottom surface and at least one side surface of the first trench 20a in the substrate 1, and a floating region 30b having a first conductivity type that surrounds the bottom surface and at least one side surface of the second trench 20b. The floating regions 30a and 30b having a first conductivity type are spaced apart from each other in the substrate 1. The depth to the bottom surfaces of the floating regions 30a and 30b with respect to the top surface is of the substrate 1 is larger than the depths to the bottom surfaces of the first trench 20a and the second trench 20b. That is, the maximum doping depth of the floating regions 30a and 30b having a first conductivity type may be larger than the depths of the first trench 20a and the second trench 20b.

The power semiconductor device 100 according to an embodiment of the present invention includes a drift region 10 having a second conductivity type that extends from below a pair of floating regions 30a and 30b having a first conductivity type in the substrate 1 through a region 14 between the pair of floating regions 30a and 30b having a first conductivity type to the body region 42 having a first conductivity type. Particularly, in the drift region 10, the doping concentration N1 of a second conductivity type between the pair of floating regions 30a and 30b having a first conductivity type is higher than the doping concentration N2 of a second conductivity type below the pair of floating regions 30a and 30b having a first conductivity type.

Meanwhile, the maximum doping depth of the body region 42 having a first conductivity type is smaller than the depths of the first trench 20a and the second trench 20b, and the maximum doping depth of the floating regions 30a and 30b having a first conductivity type may be larger than the depths of the first trench 20a and the second trench 20b. Here, in the drift region 10, the doping concentration of a second conductivity type between the pair of the floating regions 30a and 30b having a first conductivity type and the doping concentration of a second conductivity type between the first trench 20a and the second trench 20b may be larger than the doping concentration of a second conductivity type below the pair of floating regions 30a and 30b having a first conductivity type.

A conductive pattern 64 electrically connected to the gate electrodes 50a and 50b, and a conductive pattern 68 electrically connected to the source regions 44a and 44b and the body region 42 are provided on the upper portion of the substrate 1. The conductive patterns 64 and 68 serve as electrodes or contacts, and can be electrically insulated with insulating patterns 62 and 66 interposed therebetween. Meanwhile, a collector electrode 72 is disposed under the substrate 1 and, although not shown in the drawings, a buffer layer having a second conductivity type and/or a collector layer having a first conductivity type may be formed before the collector electrode 72 is formed.

If the floating regions 30a and 30b are not provided to the bottom of the trenches 20a and 20b as compared with the power semiconductor device 100 according to the embodiment of the present invention described above, it is problematic that the electric field increases at the bottom of the trenches 20a and 20b. Furthermore, if the floating regions 30a and 30b are provided only to the bottom of the trenches 20a and 20b, it is problematic that, when the distance between the trenches 20a and 20b in a G-direction MOSFET supplying the base current of the IGBT is reduced, a base current path is limited by the diffusion of impurities of a first conductivity type and therefore the cell pitch cannot be reduced below a certain distance.

Figure 2:
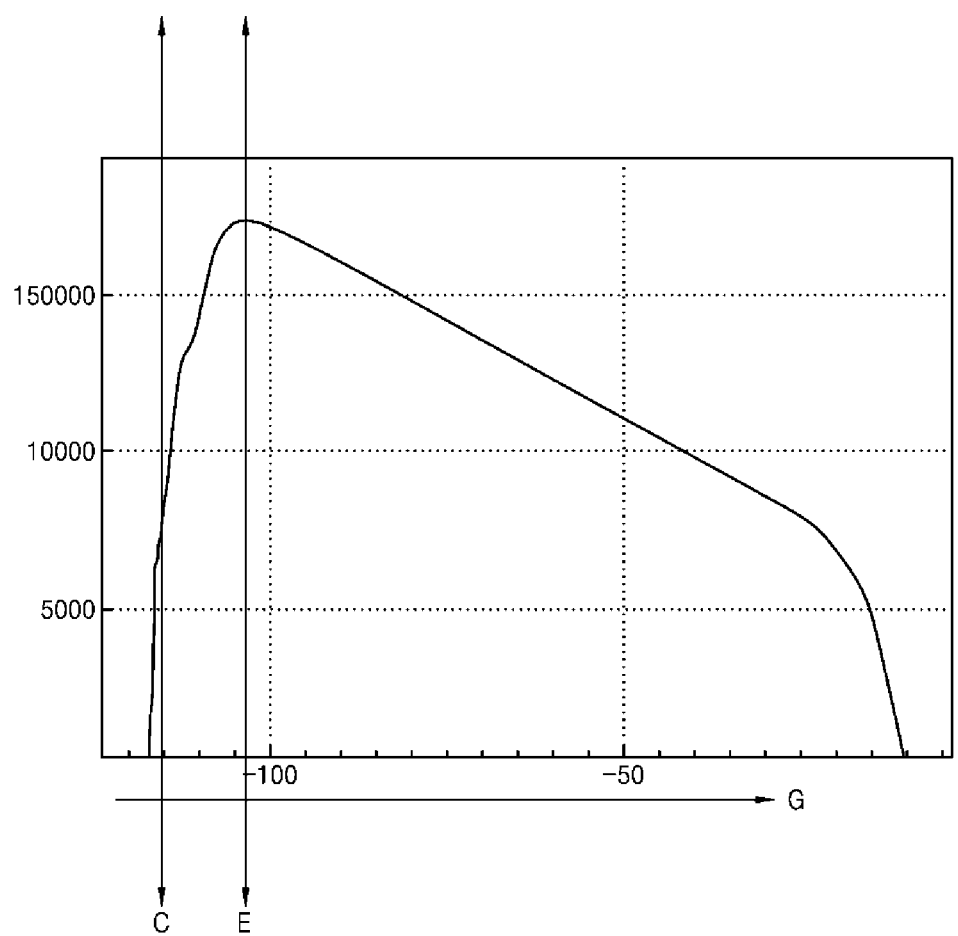
FIG. 2 is a graph illustrating the magnitude of an electric field in the G-direction in the power semiconductor device according to an embodiment of the present invention shown in FIG. 1.

FIG. 2 is a graph illustrating the magnitude of an electric field in the G-direction in the power semiconductor device according to an embodiment of the present invention shown in FIG. 1.

Referring to FIGS. 1 and 2, in the power semiconductor device according to an embodiment of the present invention, the doping concentration N1 of a second conductivity type between the pair of floating regions 30a and 30b having a first conductivity type is greater than the doping concentration N2 of a second conductivity type in the lower region 12 of the floating regions 30a and 30b having a first conductivity type. Therefore, even if the distance between the trenches 20a and 20b becomes narrow, a base current supply path is formed and an abundant base current is supplied, the balance between N1 and P1 is formed such that the maximum electric field is generated on the E surface, thereby enhancing robustness.

That is, the formation of the N1 region may help reduce or prevent the phenomenon that the impurities having a first conductivity type in the floating regions 30a and 30b are diffused to limit the base current path when the distance F between the trenches in the G-direction MOSFET supplying the base current of the IGBT is reduced. In the power semiconductor device 100 according to an embodiment of the present invention, a high cell density is obtained with a distance F, which is narrower if the same transconductance is assumed, such that the current density in the G section is reduced for the same total currents and local temperature rise is prevented, thereby improving short circuit characteristics.

The IGBT resistance and the short circuit characteristics are improved by this principle and the total amount of electric charges of the impurity concentration N1 of a second conductivity type of the region 14 and the impurity concentration P1 of a first conductivity type of the floating regions 30a and 30b are controlled such that the maximum electric field is generated on the E surface, thereby improving robustness. Here, the E surface where the maximum electric field G2 is generated is a surface lower than the bottom surfaces of the trenches 20a and 20b. Meanwhile, in modified embodiments, the surface where the maximum electric field G3 is generated may have the same height as the bottom surfaces of the floating regions 30a and 30b.

If the relationship between a static electric field and the amount of electric charge in an n-type depletion when the voltage is applied is simplified to one dimension along the C-direction, it will be $dE/dx=(1/\epsilon)*n$, which may be regarded as a function of only an n-type doping. When the carrier is injected during IGBT operation, however, it will change to $dE/dx=(1/\epsilon)*(n+h-e)$ due to the influence of the amount of the injected charges, and, in a conventional structure, when the hole density is in an excess state in the G section during turn-off, an increase in the rate of change in electric field due to a change in hole concentration reduces the area of electric field at the same maximum electric field, thereby abruptly lowering the breakdown voltage. In this structure, however, there is provided a section between the bottom surfaces of trenches 20a and 20b and the bottom surface of the body region 42, in which the rate of change in electric field is negative such that an increase in the gradient of electric field increases the area of the electric field, thereby alleviating the lowering of the breakdown voltage.

Figure 3:
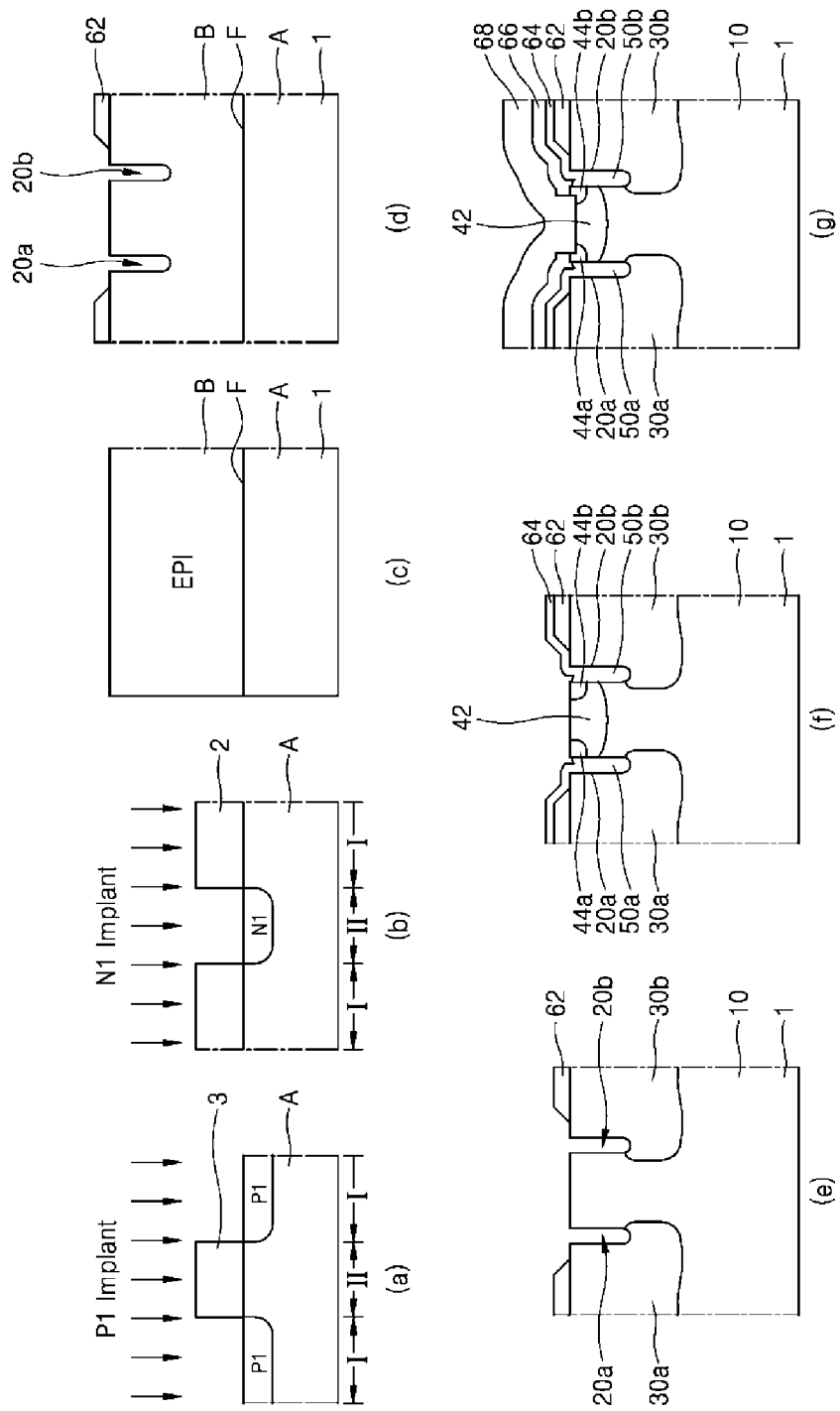
FIG. 3 shows cross-sectional views illustrating a method of manufacturing a power semiconductor device according to an embodiment of the present invention.

FIG. 3 shows cross-sectional views illustrating a method of manufacturing a power semiconductor device according to an embodiment of the present invention.

Referring to (a) and (b) of FIG. 3, impurities having a first conductivity type are implanted into a first region I on a wafer A (P1 implant), and impurities having a second conductivity type, which have a higher doping concentration than that of the impurities having a second conductivity type in the wafer A, are implanted into a second region II (N1 implant).

Referring to (c) of FIG. 3, an epitaxial layer B is formed on the wafer A. It may be understood that the substrate 1 includes the wafer A and the epitaxial layer B epitaxially grown on the wafer. It is possible to perform a doping process in which additional impurities are implanted through the upper surface of the epitaxial layer B after the epitaxial layer B is grown.

Referring to (d) of FIG. 3, parts of the epitaxial layer B are removed, and a first trench 20a and a second trench 20b spaced apart from each other in a region including a boundary between the first region I and the second region II, can be respectively formed.

Referring to (e) of FIG. 3, through a diffusion process such as heat treatment while impurities of a first conductivity type and a second conductivity type are implanted, a pair of floating regions 30a and 30b having a first conductivity type which are spaced apart from each other and surround the bottom surfaces and at least one side surface of the first and second trenches 20a and 20b can be formed. Furthermore, at least part of a drift region 10 having a second conductivity type that extends from below the pair of floating regions 30a and 30b having a first conductivity type to a region between the pair of floating regions 30a and 30b having a first conductivity type can be formed. Here, the lower portions of the floating regions 30a and 30b having a first conductivity type may include the boundary surface F between the wafer A and the epitaxial layer B.

Referring to (f) of FIG. 3, impurities are implanted into a region between the first trench 20a and the second trench 20b to form a body region 42 having a first conductivity type and a pair of source regions 44a and 44b that are spaced apart from each other and disposed adjacent to the first and second trenches 20a and 20b in the body region 42 having a first conductivity type. Subsequently, the inner walls of the first trench 20a and the second trench 20b may be lined with an insulating film and the first and second trenches 20a and 20b may be filled with a gate electrode material to form gate electrodes 50a and 50b.

Referring to (g) of FIG. 3, the cell structure of the power semiconductor device shown in FIG. 1 can be implemented by additionally forming an insulating pattern 66 and a metal wiring pattern 68.

In the power semiconductor device 100 implemented by the manufacturing method according to the embodiment of the present invention, which includes these steps, the location where the maximum electric field is generated in the base current path G may be a region below the floating regions 30a and 30b having a first conductivity type which includes the boundary surface F between the wafer A and the epitaxial layer B.

While the present invention has been described with reference to exemplary embodiments, it is to be understood that the invention is not limited to the disclosed exemplary embodiments, but, on the contrary, is intended to cover various modifications and equivalent arrangements included within the spirit and scope of the appended claims. Therefore, the true scope of the present invention should be determined by the technical idea of the appended claims.

The invention claimed is:

1. A power semiconductor device comprising:
   a pair of gate electrodes respectively disposed in a first trench and a second trench spaced apart from each other in a substrate;
   a body region having a first conductivity type disposed between the first trench and the second trench in the substrate;
   a pair of floating regions having a first conductivity type spaced apart from each other and surrounding a bottom surface and at least one side surface of the first trench and the second trench, respectively, in the substrate; and
   a drift region having a second conductivity type which extends from below the pair of floating regions having a first conductivity type in the substrate through a region between the pair of floating regions having a first conductivity type to the body region having a first conductivity type,
   wherein, in the drift region, the doping concentration of a second conductivity type between the pair of floating regions having a first conductivity type is higher than the doping concentration of a second conductivity type below the pair of floating regions having a first conductivity type.

2. The device of claim 1,
   wherein a maximum doping depth of the body region having a first conductivity type is smaller than depths of the first trench and the second trench, and a maximum doping depth of the floating regions having a first conductivity type is larger than the depths of the first trench and the second trench.

3. The device of claim 2,
   wherein, in the drift region, the doping concentration of a second conductivity type between the pair of the floating regions having a first conductivity type and the doping concentration of a second conductivity type between the first trench and the second trench are larger than the doping concentration of a second conductivity type below the pair of floating regions having a first conductivity type.

4. The device of claim 2,
   wherein the second conductivity type and the first conductivity type have opposite conductivity types and are each one of n-type and p-type.

5. The device of claim 3,
   wherein the second conductivity type and the first conductivity type have opposite conductivity types and are each one of n-type and p-type.

6. The device of claim 1, further comprising:
   a base current path between the pair of floating regions having a first conductivity type and between the first trench and the second trench,
   wherein a maximum electric field is generated in a region of a bottom surface of the pair of floating regions having a first conductivity type.

7. The device of claim 6,
   wherein the second conductivity type and the first conductivity type have opposite conductivity types and are each one of n-type and p-type.

8. The device of claim 1,
   wherein, in a vertical distribution of the electric field from an upper surface of the substrate through a region between the pair of floating regions having a first conductivity type to a lower surface of the substrate, a depth at which a maximum electric field is located is larger than the depths of the first trench and the second trench.

9. The device of claim 8,
   wherein the second conductivity type and the first conductivity type have opposite conductivity types and are each one of n-type and p-type.

10. The device of claim 1,
    wherein the substrate includes a wafer and an epitaxial layer grown on the wafer, and
    wherein lower portions of the floating regions having a first conductivity type include a boundary surface between the wafer and the epitaxial layer.

11. The device of claim 10,
    wherein the second conductivity type and the first conductivity type have opposite conductivity types and are each one of n-type and p-type.

12. The device of claim 1, further comprising:
    a pair of source regions that are spaced apart from each other and disposed adjacent to the first trench and the second trench in the substrate, respectively.

13. The device of claim 12,
    wherein the second conductivity type and the first conductivity type have opposite conductivity types and are each one of n-type and p-type.

14. The device of claim 1,
    wherein the second conductivity type and the first conductivity type have opposite conductivity types and are each one of n-type and p-type.

15. A method for fabricating a power semiconductor device, the method comprising:
    implanting impurities having a first conductivity type into a first region on a wafer;
    implanting impurities having a second conductivity type, which have a higher doping concentration than that of the impurities having a second conductivity type in the wafer, into a second region on the wafer;
    forming an epitaxial layer on the wafer;
    forming a first trench and a second trench spaced apart from each other in a region including a boundary between the first region and the second region, respectively, while removing part of the epitaxial layer;

forming a pair of floating regions having a first conductivity type which are spaced apart from each other and surround the bottom surfaces and at least one side surface of the first and second trenches, and at least part of a drift region having a second conductivity type that extends from below the pair of floating regions having a first conductivity type to a region between the pair of floating regions having a first conductivity type, by diffusing the impurities;

forming a body region having a first conductivity type and a pair of source regions that are spaced apart from each other and disposed adjacent to the first and second trenches in the body region having a first conductivity type, by implanting impurities into a region between the first trench and the second trench; and forming gate electrodes by lining the inner walls of the first trench and the second trench with an insulating film and filling the first trench and the second trench with a gate electrode material.

16. The method of claim 15, wherein lower portions of the floating region having a first conductivity type, where a maximum electric field is generated in a base current path, include a boundary surface between the wafer and the epitaxial layer.

* * * * *